United States Patent
Hsieh et al.

(10) Patent No.: US 9,007,078 B2
(45) Date of Patent: Apr. 14, 2015

(54) PIXEL ARRAY MODULE WITH SELF-TEST FUNCTION AND METHOD THEREOF

(75) Inventors: Chih-Cheng Hsieh, Hsinchu County (TW); Shang-Fu Yeh, Pingtung County (TW); Ka-Yi Yeh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 219 days.

(21) Appl. No.: 13/539,486

(22) Filed: Jul. 1, 2012

(65) Prior Publication Data

US 2013/0265066 A1    Oct. 10, 2013

(30) Foreign Application Priority Data

Apr. 6, 2012 (TW) .............................. 101112255 A

(51) Int. Cl.
| | | |
|---|---|---|
| G01R 31/00 | (2006.01) | |
| G01R 31/3187 | (2006.01) | |
| G02F 1/00 | (2006.01) | |
| H04N 1/00 | (2006.01) | |
| H04N 101/00 | (2006.01) | |
| G02F 1/1362 | (2006.01) | |

(52) U.S. Cl.
CPC ........ *G01R 31/3187* (2013.01); *H04N 2201/00* (2013.01); *H04N 1/00* (2013.01); *H04N 2101/00* (2013.01); *G02F 1/00* (2013.01); *G02F 2001/136254* (2013.01)

(58) Field of Classification Search
CPC .. H04N 1/00; H04N 2101/00; H04N 2201/00
USPC .............. 324/750.01; 348/294, 308, 266, 272
See application file for complete search history.

(56) References Cited

U.S. PATENT DOCUMENTS 4,819,038 A * 4/1989 Alt .................................. 257/10
5,276,400 A   1/1994 Denyer et al.
(Continued)

FOREIGN PATENT DOCUMENTS

| CN | 1981514 | 6/2007 |
|---|---|---|
| TW | 200617553 | 6/2006 |

(Continued)

OTHER PUBLICATIONS

L. Lizarraga, et al., "Study of a BIST Technique for CMOS Active Pixel Sensors", IEEE, VLSISOC, Oct. 2006, p. 326-331.

(Continued)

*Primary Examiner* — Huy Q Phan
*Assistant Examiner* — Temilade S Rhodes-Vivour
(74) *Attorney, Agent, or Firm* — Jianq Chyun IP Office

(57) ABSTRACT

A pixel array module with a self-test function including a test circuit unit, a plurality of test lines, and a pixel array is provided. The test circuit unit provides the self-test function. The test lines are connected between the test circuit unit and the pixel array. The pixel array is connected to the test circuit unit through the test lines and includes a plurality of pixels. Each pixel includes a transistor. Each transistor has a first terminal and a second terminal. Regarding each of the pixels, a driving signal of the transistor is transmitted from the first terminal to the second terminal thereof under a normal mode, and a test signal of the transistor is transmitted from the second terminal to the first terminal thereof under a test mode. Furthermore, a self-test method of the foregoing pixel array module is also provided.

26 Claims, 10 Drawing Sheets

(56) References Cited

U.S. PATENT DOCUMENTS

| | | | |
|---|---|---|---|
| 5,451,768 | A | 9/1995 | Hosier et al. |
| 6,388,245 | B1 | 5/2002 | Lee |
| 6,489,798 | B1 | 12/2002 | Scott-Thomas et al. |
| 6,633,335 | B1 * | 10/2003 | Kwon et al. ............. 348/308 |
| 6,956,226 | B2 | 10/2005 | Bennewitz et al. |
| 6,989,702 | B2 * | 1/2006 | Ko et al. ............... 327/203 |
| 7,667,751 | B2 | 2/2010 | Fraenkel et al. |
| 2003/0102568 | A1 * | 6/2003 | Tomishima ............ 257/777 |
| 2005/0083769 | A1 * | 4/2005 | Choi ..................... 365/232 |
| 2007/0023785 | A1 * | 2/2007 | Hasuka et al. .......... 257/215 |
| 2011/0141318 | A1 * | 6/2011 | Lee et al. ............ 348/240.2 |
| 2012/0037789 | A1 | 2/2012 | Tian et al. |

FOREIGN PATENT DOCUMENTS

| | | |
|---|---|---|
| TW | 200733369 | 9/2007 |
| TW | 200941609 | 10/2009 |
| TW | 200949794 | 12/2009 |
| TW | 201143051 | 12/2011 |
| TW | 201207814 | 2/2012 |

OTHER PUBLICATIONS

L. Lizarraga, et al., "Evaluation of a BIST Technique for CMOS Imagers", 16th IEEE Asian Test Symposium, Nov. 2007, p. 378-383.

L. Lizarraga, et al., "Experimental validation of a BIST technique for CMOS active pixel sensors", 27th IEEE VLSI Test Symposium, May 2009, p. 189-194.

Kenichi Abe, et al., "A Test Structure for Statistical Evaluation of pn Junction Leakage Current Based on CMOS Image Sensor Technology", IEEE International Conference on Microelectronic Test Structures, Mar. 2010, p. 18-22.

David C.-Y. Li, et al., "Test Results of Various CMOS Image sensor pixels", IEEE, Electrical and Computer Engineering, 2005, p. 2017-2020.

"Office Action of Taiwan Counterpart Application", issued on Mar. 27, 2014, p. 1-p. 8.

* cited by examiner

PIXEL ARRAY MODULE WITH SELF-TEST FUNCTION AND METHOD THEREOF

CROSS-REFERENCE TO RELATED APPLICATION

This application claims the priority benefit of Taiwan application serial no. 101112255, filed on Apr. 6, 2012. The entirety of the above-mentioned patent application is hereby incorporated by reference herein and made a part of this specification.

BACKGROUND OF THE DISCLOSURE

1. Field of the Disclosure

The disclosure relates to a pixel array module and a test method thereof. Particularly, the disclosure relates to a pixel array module with a self-test function and a method thereof.

2. Description of Related Art

FIG. 1 is a schematic diagram of a conventional three-dimensional (3D) stacked image sensor. Referring to FIG. 1, the 3D stacked image sensor 100 has a development potential due to characteristics of high resolution and high bandwidth. A structure of the 3D image sensing chip includes a pixel array 110 of a top layer, an analog-to-digital converter (ADC) array 120 of a second layer and an image processor array 130 of a third layer, where the components of each layer are stacked through 3D stacking elements 140. The chips of each layer have to be tested before stacking, so as to pick out good chips for a post stacking process. In this way, a yield of the stacked chips may be enhanced, and manufacturing cost may be reduced.

However, when the pixel array 110 of the top layer is tested before the stacking, that a pixel photosensitive signal cannot be read is encountered since in the structure of the 3D image sensor 100, the pixel array 110 of the top layer generates an analog voltage signal after sensing light, and such signal has to be read out by the ADC array 120 of the second layer. However, before the chips are stacked, the voltage signal of the pixel array 110 cannot be read by the ADC 120 of the second layer, and once the voltage signal of the pixel array 110 cannot be read, the test on the layer of the pixel array cannot be performed. When the untested chips are stacked, a yield of the chip stacking may be decreased.

SUMMARY OF THE DISCLOSURE

The disclosure is directed to a pixel array module with a self-test function, which includes a test circuit unit, a plurality of test lines and a pixel array. The test circuit unit provides a self-test function. The test lines are coupled between the test circuit unit and the pixel array. The pixel array is coupled to the test circuit unit through the test lines and includes a plurality of pixels. Each of the pixels includes a transistor. Each of the transistors has a first terminal and a second terminal. Regarding each of the pixels, a driving signal of the transistor is transmitted from the first terminal to the second terminal thereof under a normal mode, and a test signal of the transistor is transmitted from the second terminal to the first terminal thereof under a test mode.

The disclosure provides a self-test method for a pixel array module. The pixel array module includes a pixel array. The pixel array includes a plurality of pixels. Each of the pixels includes a transistor. Each of the transistors has a first terminal and a second terminal. The self-test method includes following steps. The pixel array is switched to a test mode. A test signal is provided to test at least one of the pixels by using a stable power. The test signal is compared with a reference signal to output a comparison result. It is determined whether a number of the pixels in the pixel array that fail the test is greater than a threshold according to the comparison result, so as to output a determination result. The test signal is transmitted from the second terminal of the transistor of the pixel to be tested to the first terminal thereof under a test mode. A driving signal of each of the transistors is transmitted from the first terminal to the second terminal thereof under a normal mode.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
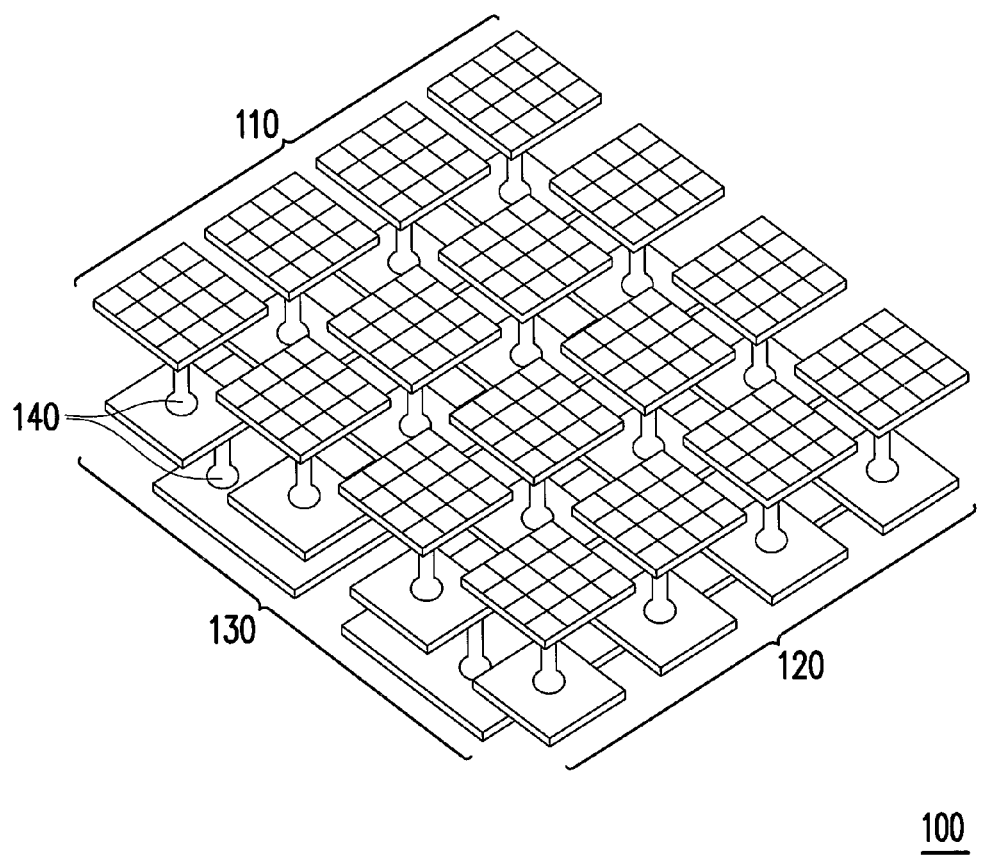
FIG. 1 is a schematic diagram of a conventional three-dimensional (3D) stacked image sensor.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure provides a pixel array module with a self-test function, in which a self-test circuit is built. The self-test circuit is not only capable of reading the voltage signal generated by the pixel due to light-sensing, but also capable of detecting a bad pixel or a hot pixel, where the bad pixel refers to a pixel having no response to a light source under a test mode, and the hot pixel refers to a pixel having an excessive response in a dark environment under the test mode. When a number of the bad pixels or the hot pixels exceeds a predetermined threshold, the self-test circuit determines that the pixel array is failed. In this way, the failed pixel array is avoided to be used in a post stacking process, by which a yield of chip stacking is improved. A plurality of exemplary embodiments is provided below to describe the disclosure in detail.

Figure 2:
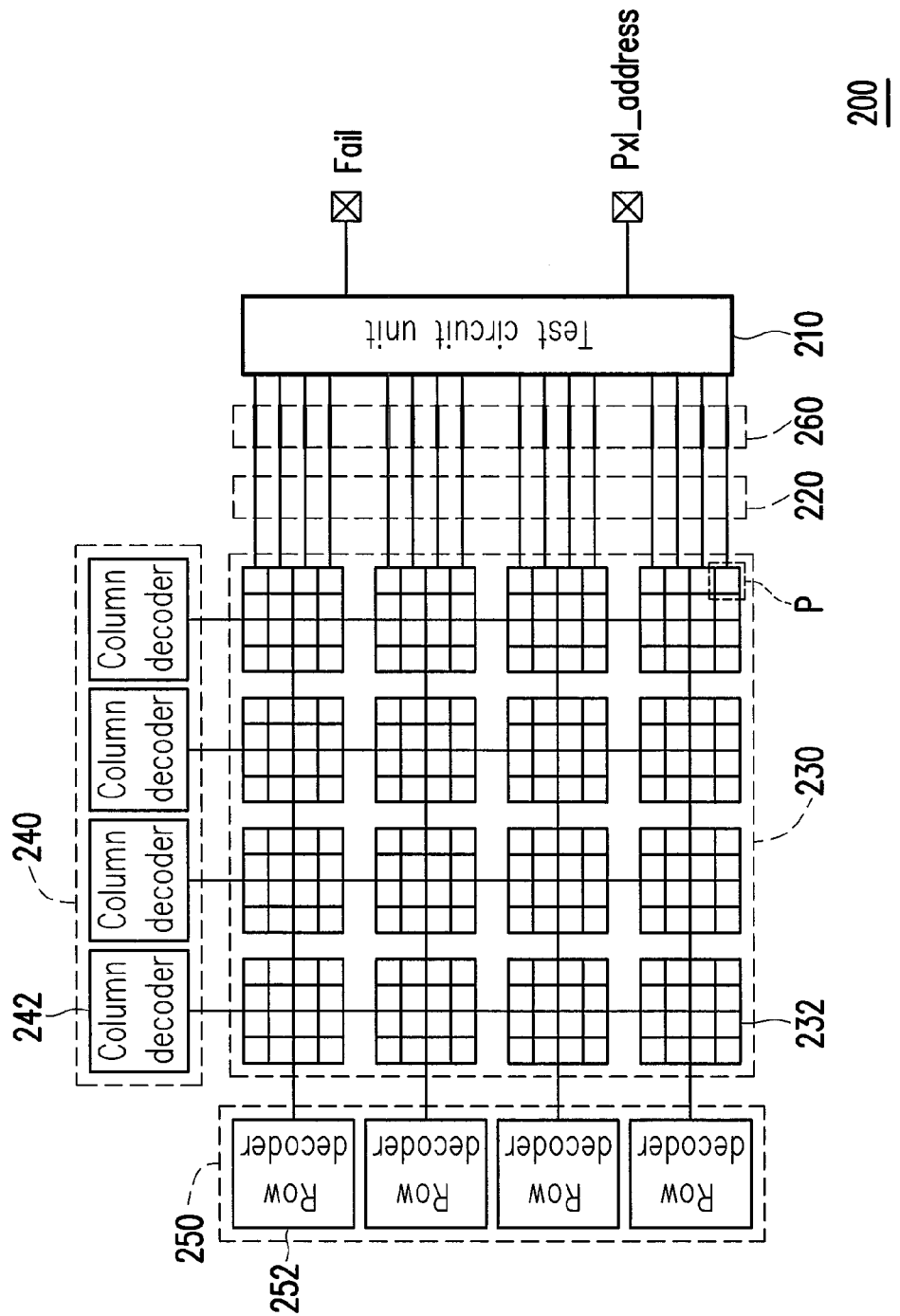
FIG. 2 is a schematic diagram of a pixel array module according to an exemplary embodiment of the disclosure.

FIG. 2 is a schematic diagram of a pixel array module according to an exemplary embodiment of the disclosure. Referring to FIG. 2, the pixel array module 200 of the exemplary embodiment includes a test circuit unit 210, a plurality of test lines 220, a pixel array 230, a column decoder array 240 and a row decoder array 250. The test lines 220 are coupled between the test circuit unit 210 and the pixel array 230. The pixel array 230 is coupled to the test circuit unit 210 through the test lines 220 and includes a plurality of pixels P. The test circuit unit 210 provides a self-test function of the pixel array 230 through the test lines 220. Moreover, after the self-test of the pixel array 210 is completed, if the number of abnormal pixels is greater than a predetermined threshold, the test circuit unit 210 determines that the pixel array 230 is failed. Now, the output port (Fail) of the test circuit unit 210 outputs logic 1, and another output port (Pxl_address) outputs the addresses of the abnormal pixels. In the present exemplary embodiment, the abnormal pixels include bad pixels and hot pixels, and the predetermined threshold is set by a designer according to the yield of the pixel array.

In detail, in the present exemplary embodiment, the pixel array 230 is, for example, applied in the three-dimensional (3D) stacked image sensor 100 of FIG. 1 to serve as an image sensing pixel array, though the pixel array module of the disclosure and the self-test method thereof are not limited to be used in the 3D stacked image sensor, and the self-test method and a concept thereof can be widely used in other types of electronic devices having a pixel array. The 3D stacked image sensor is only used as an example, and the disclosure is not limited thereto.

Regarding the application of the 3D stacked image sensor, the pixel array 230 of the present exemplary embodiment can be divided into a plurality of sub pixel arrays 232. Namely, the pixel array 230 is composed of a plurality of the sub pixel arrays 232. Each of the sub pixel arrays 232 is coupled to a signal converter array of a lower layer through a 3D chip stacking element 140 of FIG. 1. Here, the 3D chip stacking element is, for example, a through silicon via (TSV), a redistribution layer (RDL) wire, and a micro-bump, etc., and the signal converter array is, for example, an analog-to-digital converter array, which are not limited by the disclosure.

In view of a circuit operation, each of the sub pixel arrays 232 operates in parallel. The column decoder array 240 and the row decoder array 250 generate a column control signal and a row control signal for transmitting to each of the sub pixel arrays 232, and each of the sub pixel arrays 232 outputs a voltage signal of one pixel every time. In the present exemplary embodiment, a method for the column decoder array 240 and the row decoder array 250 controlling the pixel array 230 has been described in detail in related paragraphs in Taiwan Patent No. 100104778, which is referred and incorporated herein to become a part of the disclosure, and details thereof is not repeated.

Referring to FIG. 2, in the whole pixel array 230, the pixels of each row share a same test line 220, and the test line has two operation modes including a normal mode and a test mode, which are describe later. Moreover, in the present exemplary embodiment, the pixel array module 200 may further include a plurality of fuses 260, which are respectively coupled between the test lines 220 and the test circuit unit 210. After the self-test method of the disclosure is completed, the fuses 260 can be fused to block the electrical connection between the pixel array 230 and the test circuit unit 210, so as to reduce a load of the electronic device caused by the test circuit unit 210 during application of the pixel array 230. In other exemplary embodiments, a switch network can be coupled between the test circuit unit 210 and the test lines 220, so that the pixel array module 200 can be switched between the normal mode and the test mode.

Figure 3:
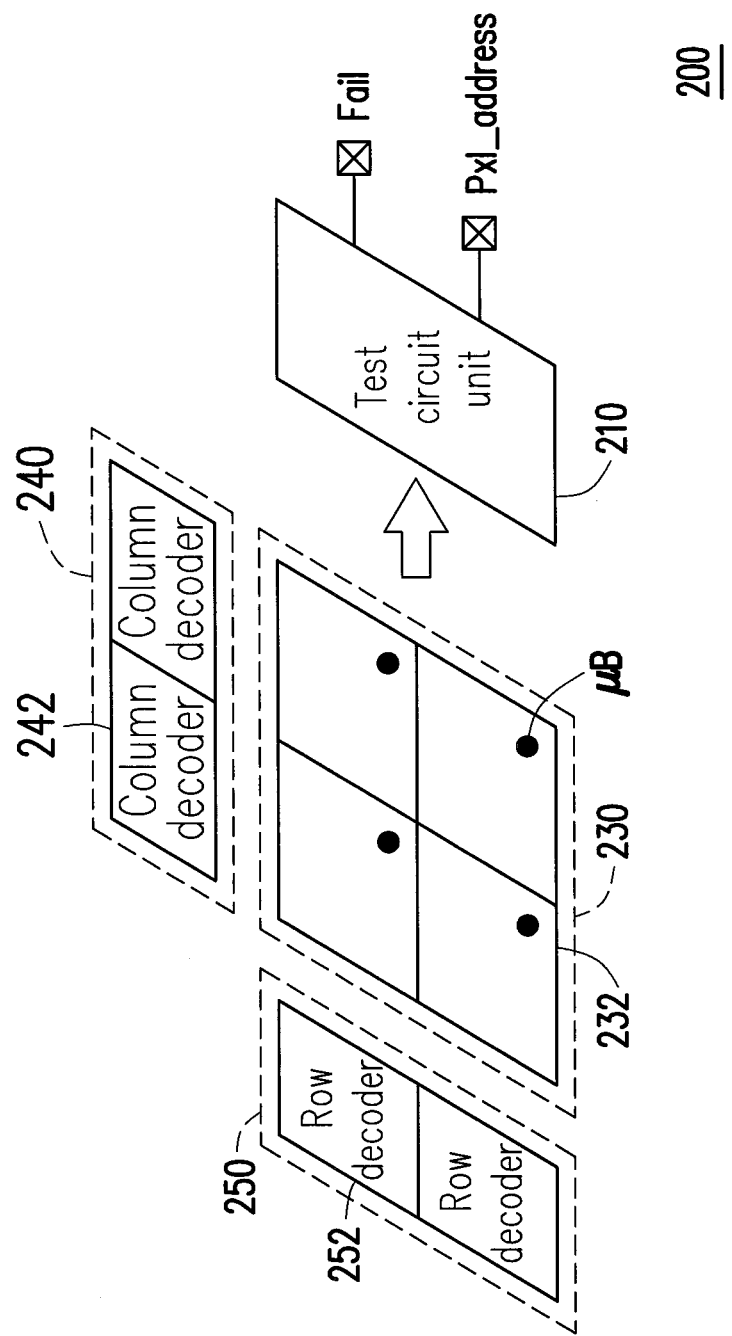
FIG. 3 is a schematic diagram of the pixel array module of the embodiment of FIG. 2 in a self-test process.
Figure 4:
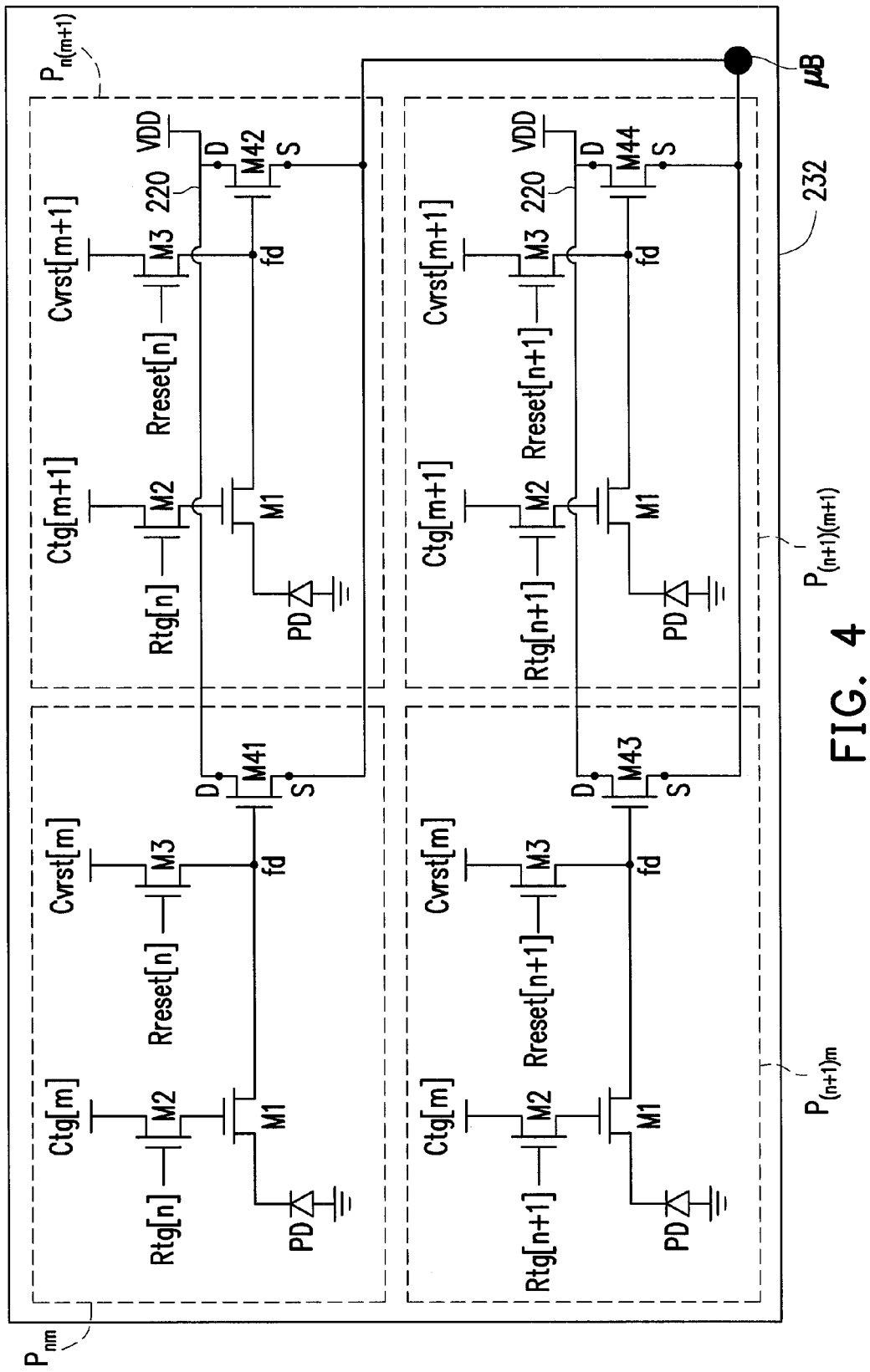
FIG. 4 is a circuit schematic diagram of each pixel in a sub pixel array of the embodiment of FIG. 3.

FIG. 3 is a schematic diagram of the pixel array module of the embodiment of FIG. 2 in a self-test process. FIG. 4 is a circuit schematic diagram of each pixel in a sub pixel array of the embodiment of FIG. 3. Referring to FIG. 3 and FIG. 4, for simplicity's sake, only the test circuit unit 210, the pixel array 230, the column decoder array 240 and the row decoder array 250 of the pixel array module 200 are illustrated in FIG. 3. Moreover, the pixel array 230 of FIG. 3 is only represented by four sub pixel arrays 232, and the sub pixel array 232 of FIG. 4 is only represented by four pixels P, though the disclosure is not limited thereto.

In detail, referring to FIG. 3 and FIG. 4, under the normal mode, all of the test lines 220 are, for example, coupled to a system voltage VDD, which provides a stable power to the pixel array 230. In the test mode, voltage signals of the pixels P can be sequentially output to the test circuit unit 210 through the test lines 220. The test circuit unit 210 can accordingly determine whether each of the pixels normally functions. If an abnormal pixel is detected, the test circuit unit 210 records an address thereof. After the test of the whole pixel array 230 is completed, if the number of the abnormal pixels is greater than the predetermined threshold, the test circuit unit 210 determines that the pixel array 230 is failed. Then, the output port (Fail) of the test circuit unit 210 outputs the logic 1, and the other output port (Pxl_address) outputs the addresses of the abnormal pixels. The logic 1 output by the output port (Fail) is only used as an example, and the disclosure is not limited thereto.

In FIG. 4, each pixel includes a source follower transistor M41, M42, M43 or M44, which is used for transmitting the voltage signal generated by the pixel to a read circuit. A first terminal D of the source follower transistor M41, M42, M43 or M44 of each pixel is connected to the test line 220. All of the pixels of a same row share a same test line 220. In the present embodiment, a pixel $P_{nm}$ and a pixel $P_{n(m+1)}$ are located on a same pixel row, and a pixel $P_{(n+1)m}$ and a pixel $P_{(n+1)(m+1)}$ are located on another pixel row. A second terminal S of the source follower transistor M41, M42, M43 or M44 of each pixel is connected to a stacking element μB, and is further connected to an analog-to-digital converter (ADC) array of a lower layer through the stacking element μB. Here, if the source follower transistor M4 is implemented by an N-type metal oxide semiconductor (NMOS) transistor, the first terminal D and the second terminal S thereof are respectively a drain and a source of the NMOS transistor.

In other words, regarding each of the pixels, a driving signal provided by the system voltage VDD under the normal mode is transmitted from the first terminal D of the source follower transistor M41, M42, M43 or M44 to the second terminal S thereof. In this way, the voltage signal generated by each of the pixels can be read by the ADC of the second layer. Two operation modes including a normal mode and a test mode of the circuit are described below.

Figure 5:
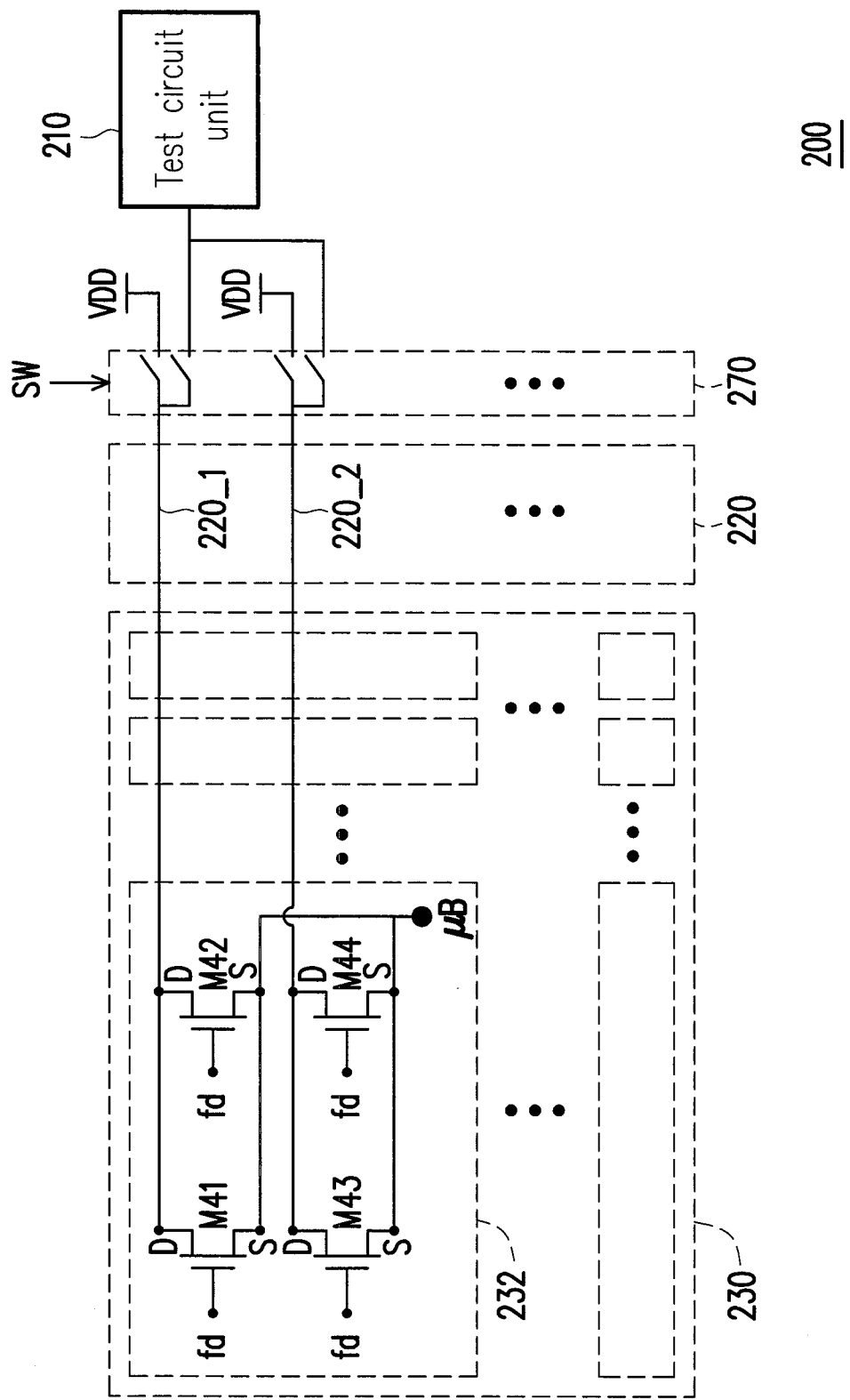
FIG. 5 is a schematic diagram of the sub pixel array of the embodiment of FIG. 4 before the self-test.

FIG. 5 is a schematic diagram of the sub pixel array of the embodiment of FIG. 4 before the self-test. Referring to FIG. 5, for simplicity's sake, only the source follower transistors M41-M44 of each sub pixel array are illustrated in FIG. 5. In the present exemplary embodiment, a switch network 270 is coupled between the test circuit unit 210 and the test lines 220, which is used to select at least one pixel row of the pixel array 230 for testing according to an instruction of the test circuit unit 210. The switch network 270 includes a plurality of switches. The switches are controlled by a switching signal SW, and switch different pixel rows between the normal mode and the test mode. The switching signal SW can be set by the test circuit unit 210 according to the pixel row to be tested, or can be generated by another controller.

Figure 6:
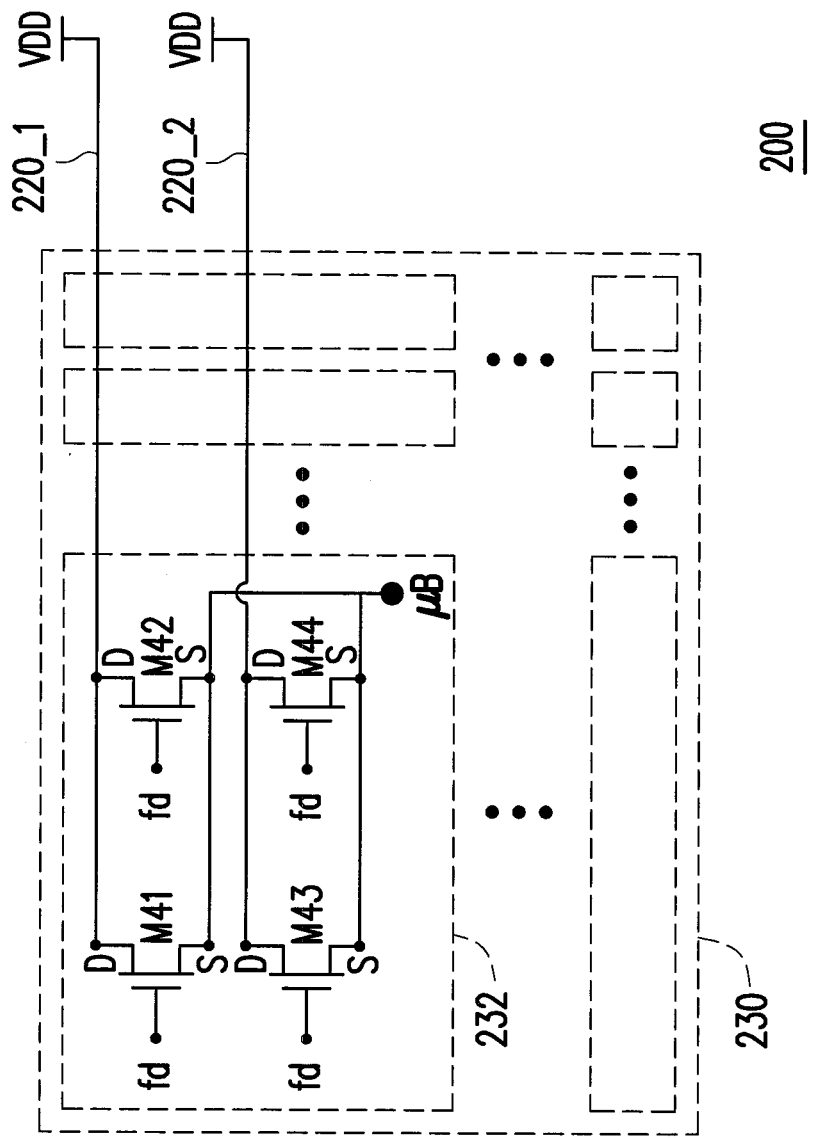
FIG. 6 is a schematic diagram of the sub pixel array of the embodiment of FIG. 4 in the normal mode.
Figure 7:
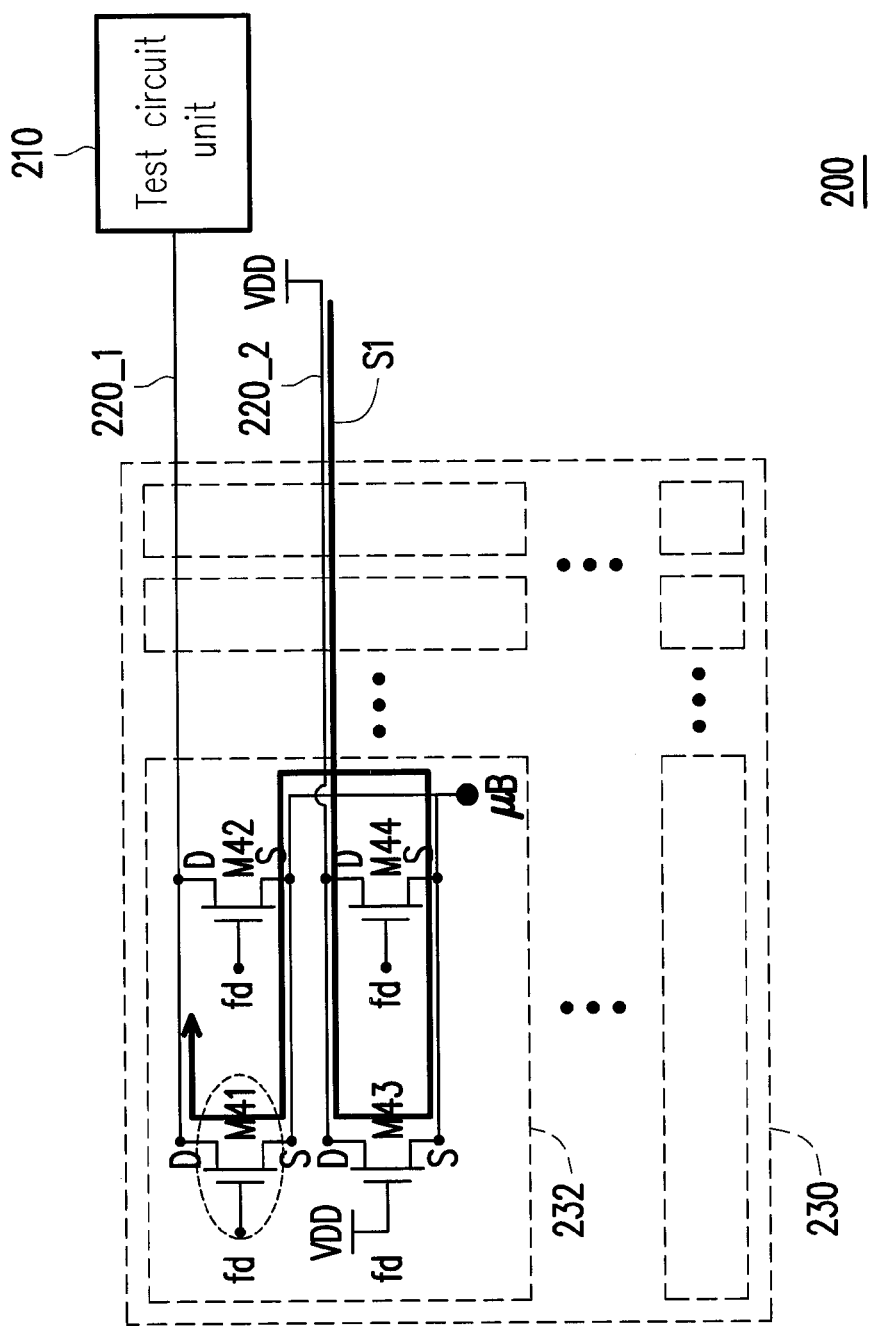
FIG. 7 and FIG. 8 are schematic diagrams of different pixel rows of the embodiment of FIG. 4 in the test mode.
Figure 8:
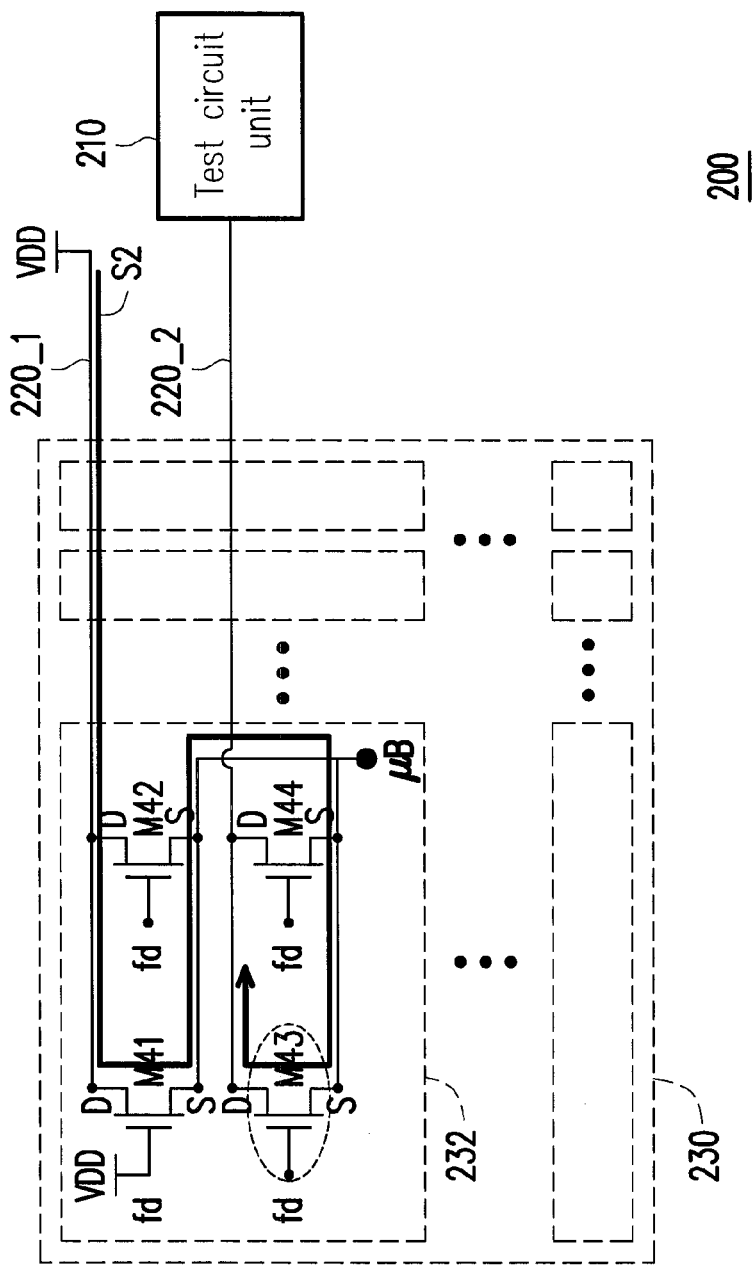

FIG. 6 is a schematic diagram of the sub pixel array of the embodiment of FIG. 4 in the normal mode. FIG. 7 and FIG. 8 are schematic diagrams of different pixel rows of the embodiment of FIG. 4 in the test mode. Referring to FIG. 6-FIG. 8, in FIG. 6, the pixel array 230 is operated in the normal mode, and the switch network 270 selects to couple the first terminals D of the source follower transistors M41-M44 to the system voltage VDD. Therefore, all of the test lines 220 are connected to the system voltage VDD, which provides a stable voltage level to the first terminals D of the source follower transistors M41-M44. The second terminals S of the source follower transistors M41-M44 are coupled to the stacking element μB, so that the voltage signals generated by the pixels can be transmitted to the ADC array of the lower layer. The operation method of the pixel array 230 in the normal mode has been described in detail in related paragraphs in Taiwan Patent No. 100104778, which is referred and incorporated herein to become a part of the disclosure, and details thereof is not repeated.

Then, in FIG. 7, a pixel $P_{nm}$ in an $n^{th}$ pixel row is tested under the test mode. In the present embodiment, the first terminal D of the source follower transistor M41 of the pixel $P_{nm}$ to be tested is coupled to the test circuit unit 210 through a test line 220_1 coupled to itself. The second terminal S of the source follower transistor M43 is coupled to the system voltage VDD through the source follower transistor M43 and a test line 220_2. The test line 220_2 is coupled to the source follower transistor M43 of the pixel $P_{(n+1)m}$ that is not to be tested. Now, the test signal S1 is provided by the system voltage VDD, which is transmitted from the second terminal S of the source follower transistor M41 of the pixel $P_{nm}$ to be tested to the first terminal D thereof. Moreover, the system voltage VDD controls the source follower transistor M43 to be in a turn-on state, so as to facilitate transmitting the test signal S1 to the test circuit unit 210. Meanwhile, under the test mode of FIG. 7, the first terminal D of the source follower transistor M43 of the pixel $P_{(n+1)m}$ that is not to be tested is coupled to the system voltage VDD though the test line 220_2 coupled to itself, and the second terminal S of the source follower transistor M43 of the pixel $P_{(n+1)m}$ that is not to be tested is coupled to the stacking element μB.

On the other hand, in FIG. 8, a pixel $P_{(n+1)m}$ in an $(n+1)^{th}$ pixel row is tested under the test mode. In the present embodiment, the first terminal D of the source follower transistor M43 of the pixel $P_{(n+1)m}$ to be tested is coupled to the test circuit unit 210 through the test line 220_2 coupled to itself. The second terminal S of the source follower transistor M43 is coupled to the system voltage VDD through the source follower transistor M41 and a test line 220_1. The test line 220_1 is coupled to the source follower transistor M41 of the pixel $P_{nm}$ that is not to be tested. Now, the test signal S2 is provided by the system voltage VDD, which is transmitted from the second terminal S of the source follower transistor M43 of the pixel $P_{(n+1)m}$ to be tested to the first terminal D thereof. Moreover, the system voltage VDD controls the source follower transistor M41 to be in the turn-on state, so as to facilitate transmitting the test signal S2 to the test circuit unit 210. Meanwhile, under the test mode of FIG. 8, the first terminal D of the source follower transistor M41 of the pixel $P_{nm}$ that is not to be tested is coupled to the system voltage VDD though the test line 220_1 coupled to itself, and the second terminal S of the source follower transistor M41 of the pixel $P_{nm}$ that is not to be tested is coupled to the stacking element μB.

In conclusion, under the test mode, since the chips are still not stacked, the voltage signals generated by the pixels cannot be read by the ADCs of the second layer. Therefore, in the disclosure, the test lines 220 are used to transmit the voltage signals of the pixels to the test circuit unit 210 for reading. In the exemplary embodiment of FIG. 7, in order to read the signal of the pixel $P_{nm}$, the test line 220_1 is connected to the system voltage VDD for providing a stable power to the source follower transistor M41 of the pixel P. The test line 2202 is still connected to the system voltage VDD, and now a transistor M3 of the pixel $P_{(n+1)m}$ is turned on to charge a node fd in the pixel $P_{(n+1)m}$ to a high level, so that the source follower transistor M43 of the pixel $P_{(n+1)m}$ is turned on, and the level of the system voltage VDD is transmitted to the source follower transistor M41 of the pixel $P_{nm}$ through the source follower transistor M43 of the pixel $P_{(n+1)m}$. In this way, the second terminal S of the source follower transistor M41 of the pixel $P_{nm}$ obtains a voltage level, and the source follower transistor M41 can normally operate to transmit the voltage signal generated by the pixel $P_{nm}$ to the test circuit unit 210. Similarly, the voltage signal generated by the pixel $P_{(n+1)m}$ can also be transmitted to the test circuit unit 210 through the test line 220_2, which is not repeated herein.

Moreover, in view of pixel rows and the switch network, under the test mode, when at least one of the pixel rows in the pixel array 230 is coupled to the test circuit unit 210 through the corresponding test line, the pixel rows other than the above at least one pixel row are coupled to the system voltage VDD through the corresponding test lines. For example, in FIG. 7, when the pixel row containing the pixel $P_{nm}$ is coupled to the test circuit unit 210 through the test line 220_1, the pixel row containing the pixel $P_{(n+1)m}$ is coupled to the system voltage VDD through the test line 220_2. Now, in the pixel row to be tested, the switch network 270 selects to couple the first terminals D of the source follower transistors thereon to the test circuit unit 210. Moreover, in the pixel row that is not to be tested, the switch network 270 selects to couple the first terminals D of the source follower transistors thereon to the system voltage VDD.

In the aforementioned exemplary embodiment, under the test mode, although each time one pixel is tested, the disclosure is not limited thereto. In other exemplary embodiments, the self-test method of the disclosure may simultaneously test a plurality of pixels. Moreover, during the test, the source follower transistor where the test signal (for example, S1) passes through is not limited to be the source follower transistor (for example, M43) of the adjacent pixel row.

Figure 9:
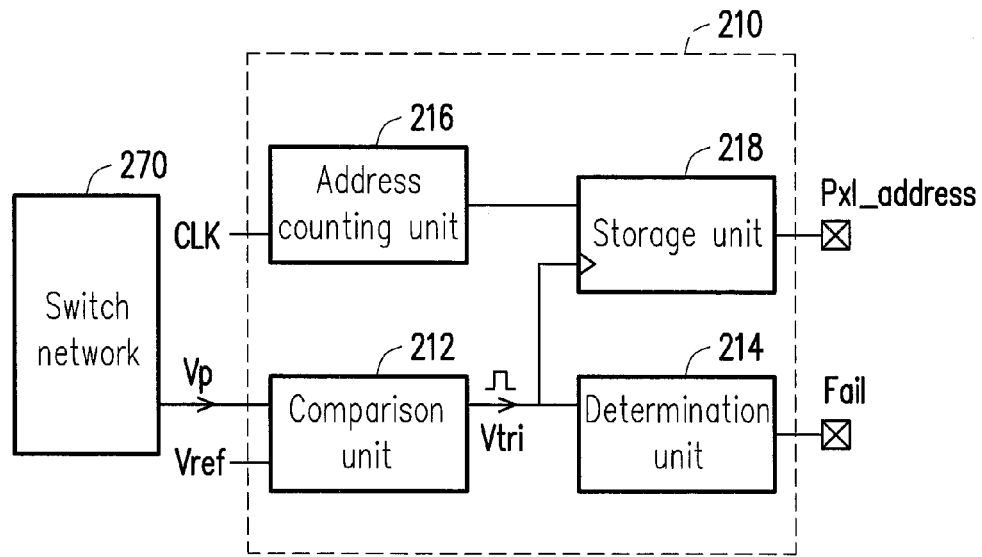
FIG. 9 is a block schematic diagram of a test circuit unit according to an exemplary embodiment of the disclosure.

FIG. 9 is a block schematic diagram of a test circuit unit according to an exemplary embodiment of the disclosure. Referring to FIG. 9, the test circuit unit 210 of the present exemplary embodiment includes a comparison unit 212, a determination unit 214, an address counting unit 216 and a storage unit 218. The comparison unit 212 is coupled to the pixel array 230 through the switch network 270, and compares a test signal Vp of different pixels with a reference signal Vref, and outputs a comparison result Vtri. The address counting unit 216 is coupled to the comparison unit 212 for counting a pixel address, and outputs a counting result to the storage unit 218. The storage unit 218 is coupled to the comparison unit 212 and the address counting unit 216 for storing the comparison result Vtri and the counting result and recording the addresses and numbers of the pixels that pass through the test or fail the test. The determination unit 214 is coupled to the comparison unit 212, and determines whether the number of the pixels in the pixel array 230 that fail the test is greater than a predetermined threshold according to the comparison result Vtri, and outputs a determination result. In the present exemplary embodiment, setting of the reference signal Vref can be different along with different test modes. The test modes of the present exemplary embodiment may include a bad pixel test mode and a hot pixel test mode.

Figure 10:
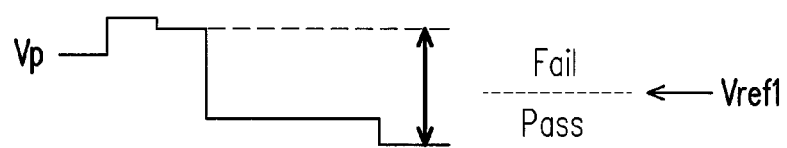
FIG. 10 is a schematic diagram illustrating comparison of a pixel voltage value and a reference voltage in a bad pixel test mode according to an exemplary embodiment of the disclosure.

The bad pixel test mode of the present exemplary embodiment is a test mode including a light source. Namely, under the bad pixel test mode, the pixel array 230 is irradiated by the light source, and the test circuit unit 210 is configured to test the pixels having no response to the light source. Now, a level of the reference signal Vref can be set to a first reference voltage Vref1, as that shown in FIG. 10. FIG. 10 is a schematic diagram illustrating comparison of a pixel voltage value and a reference voltage in the bad pixel test mode according to an exemplary embodiment of the disclosure. Referring to FIG. 9 and FIG. 10, in the bad pixel test mode, if the pixel voltage value of the test signal Vp is smaller than the first reference voltage Vref1, the test circuit unit 210 determines that the pixel passes through the test.

In detail, under the bad pixel test mode, after the pixel senses the light, an output voltage level of the test signal Vp is smaller than a level of the first reference voltage Vref1. Therefore, when Vp<Vref1, the pixel is determined to be normal, and otherwise the pixel is determined to be failed, and the failed pixel is the bad pixel. When the pixel is determined to be failed, the comparison unit 212 sends a pulse wave to serve as the comparison result Vtri. The pulse wave stores the pixel address (i.e. the address of the pixel to be tested) output by the address counting unit 216 in the storage unit 218. The determination unit 214 records the number of the pulse waves. In another exemplary embodiment, the number of the pulse waves can be recorded in the storage unit 218. After all of the pixels are tested, if the number of the pulse waves is greater than a setting value N (which can be set by the user), the output port Fail of the determination unit 214 outputs the logic 1, which represents that the pixel array 230 is failed, otherwise, the logic 0 is maintained.

Figure 11:
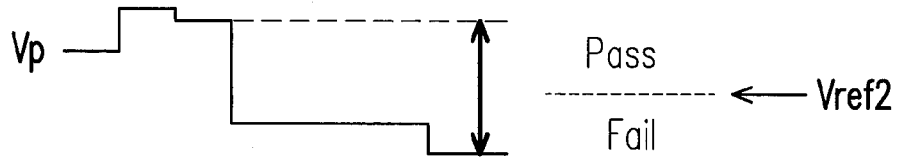
FIG. 11 is a schematic diagram illustrating comparison of a pixel voltage value and a reference voltage in a hot pixel test mode according to an exemplary embodiment of the disclosure.

On the other hand, the hot pixel test mode of the present exemplary embodiment is a test not including the light source. Namely, under the hot pixel test mode, the test circuit unit 210 is configured to test the pixels having excessive response in the dark environment. Now, the level of the reference signal Vref can be set to a second reference voltage Vref2, as that shown in FIG. 11. FIG. 11 is a schematic diagram illustrating comparison of a pixel voltage value and a reference voltage in the hot pixel test mode according to an exemplary embodiment of the disclosure. Referring to FIG. 9 and FIG. 11, in the hot pixel test mode, if the pixel voltage value of the test signal Vp is greater than the second reference voltage Vref2, the test circuit unit 210 determines that the pixel passes through the test.

In detail, under the hot pixel test mode, the output voltage level of the test signal Vp is greater than the level of the second reference voltage Vref2. Therefore, when Vp>Vref2, the pixel is determined to be normal, and otherwise the pixel is determined to be failed, and the failed pixel is the hot pixel. When the pixel is determined to be failed, the comparison unit 212 sends a pulse wave to serve as the comparison result Vtri. After all of the pixels are tested, if the number of the pulse waves is greater than the setting value N, the output port Fail of the determination unit 214 outputs the logic 1, which represents that the pixel array 230 is failed, otherwise, the logic 0 is maintained. In the exemplary embodiments of FIG. 10 and FIG. 11, magnitudes of the first reference voltage Vref1 and the second reference voltage Vref2 are set to be different, though the disclosure is not limited thereto, and in other exemplary embodiments, magnitudes of the first reference voltage Vref1 and the second reference voltage Vref2 are set to be the same. Namely, regardless of the bad pixel test mode or the hot pixel test mode, the reference level compared to the test signal Vp is the same.

Figure 12:
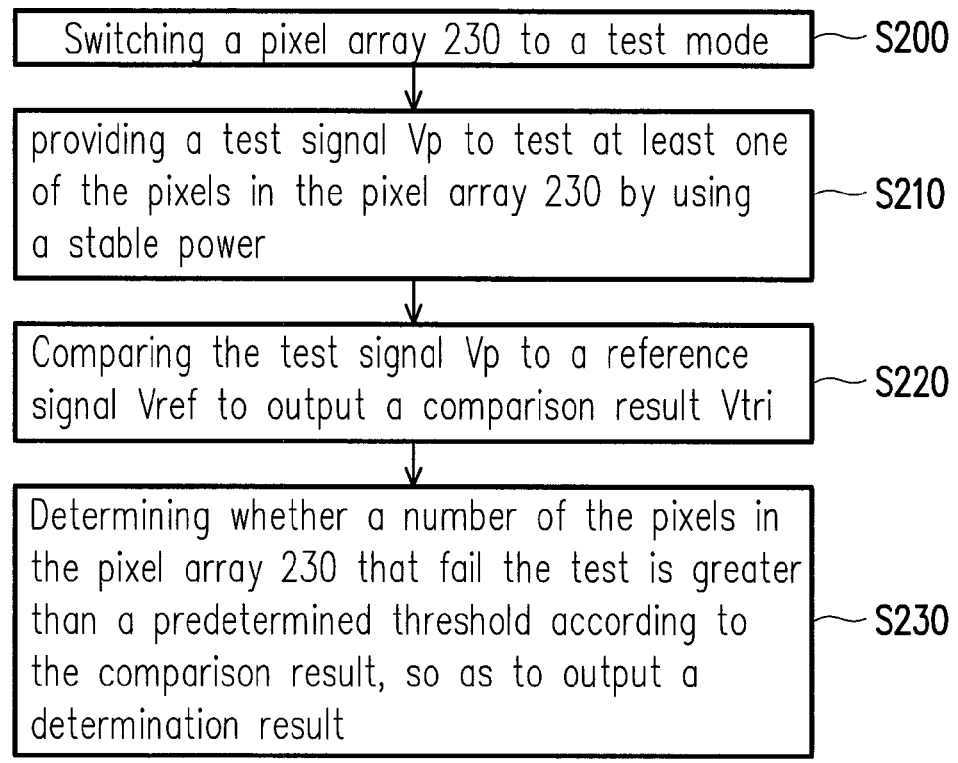
FIG. 12 is a flowchart illustrating a self-test method for a pixel array module according to an exemplary embodiment of the disclosure.

FIG. 12 is a flowchart illustrating a self-test method for a pixel array module according to an exemplary embodiment of the disclosure. Referring to FIG. 4 and FIG. 12, the self-test method of the present exemplary embodiment is at least adapted to the pixel array module 200 of FIG. 2, and includes following steps.

First, in step S200, the pixel array 230 is switched to a test mode, for example, the bad pixel test mode or the hot pixel test mode. In such step, if the pixel array 230 is switched to the bad pixel test mode, the self-test method of the present exemplary embodiment may further include providing a light source to irradiate the pixel array 230.

Then, in step S210, a stable power provided by the system voltage VDD is used to provide a test signal to test at least one of the pixels in the pixel array 230. In such step, the test signal is transmitted from the second terminal S of the source follower transistor of the pixel to be tested to the first terminal D thereof. A transmitting direction of the test signal under the test mode is reversed to a transmitting direction of the driving signal (which is transmitted from the first terminal D to the second terminal S thereof) of the source follower transistor under the normal mode.

Then, in step S220, the test signal Vp is compared to the reference signal Vref to output the comparison result Vtri. In such step, if the pixel array 230 is switched to the bad pixel test mode, a level of the reference signal Vref can be set to the first reference voltage Vref1. If the pixel array 230 is switched to the hot pixel test mode, a level of the reference signal Vref can be set to the second reference voltage Vref2.

Then, in step S230, it is determined whether a number of the pixels in the pixel array 230 that fail the test is greater than a predetermined threshold according to the comparison result, so as to output a determination result. In such step, if the pixel array 230 is determined to be failed, the output port Fail of the test circuit unit 210 outputs the logic 1, and the other output port Pxl_address outputs an address of the abnormal pixel. Moreover, the predetermined threshold of such step is set by the user according to a yield to be achieved.

Moreover, since those skilled in the art can learn enough instructions and recommendations of the self-test method of the disclosure from the descriptions of the embodiments of FIG. 2 to FIG. 11, detailed description thereof is not repeated.

In summary, the self-test method of the disclosure can resolve unable to read the signal of the pixel array before the chip stacking, and can detect abnormal pixels in the pixel array. Therefore, according to the self-test method of the disclosure, the pixel array with a good quality can be found to improve a yield of chip stacking.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A pixel array module with a self-test function, comprising:
   a test circuit unit, providing the self-test function;
   a plurality of test lines, coupled to the test circuit unit; and
   a pixel array, coupled to the test circuit unit through the test lines, and comprising a plurality of pixels, wherein each of the pixels comprises a transistor having a first terminal and a second terminal,
   wherein regarding each of the pixels, a driving signal of the transistor is transmitted from the first terminal to the second terminal thereof under a normal mode, and a test signal of the transistor is transmitted from the second terminal to the first terminal thereof under a test mode,
   wherein under the normal mode, the first terminals of the transistors are coupled to a stable power through the test lines, and the second terminals of the transistors are coupled to a stacking element.

2. The pixel array module as claimed in claim 1, wherein under the normal mode, the driving signal is provided by the stable power, and is transmitted from the first terminals of the transistors to the second terminals thereof.

3. The pixel array module as claimed in claim 1, wherein under the test mode, the first terminal of the transistor of a pixel to be tested is coupled to the test circuit unit through the test line coupled to itself, and the second terminal of the transistor of the pixel to be tested is coupled to the stable power through the test line coupled to the transistor of a pixel that is not to be tested.

4. The pixel array module as claimed in claim 3, wherein under the test mode, the test signal is provided by the stable power, and is transmitted from the second terminal of the transistor of the pixel to be tested to the first terminal thereof.

5. The pixel array module as claimed in claim 1, wherein under the test mode, the first terminal of the transistor of a pixel that is not to be tested is coupled to the stable power through the test line coupled to itself, and the second terminal of the transistor of the pixel that is not to be tested is coupled to the stacking element.

6. The pixel array module as claimed in claim 1, wherein the pixel array comprises a plurality of pixel rows, the test lines are respectively coupled to different pixel rows in the pixel array, and the test lines are coupled to the first terminals of the transistors.

7. The pixel array module as claimed in claim 6, wherein under the test mode, when at least one of the pixel rows is coupled to the test circuit unit through the corresponding test line, the other pixel rows other than the at least one pixel row are coupled to the stable power through the corresponding test lines.

8. The pixel array module as claimed in claim 1, wherein the test mode comprises a first test mode, and under the first test mode, when a pixel voltage value of the test signal is smaller than a first reference voltage, the test circuit unit determines that the pixel to be tested passes through the test.

9. The pixel array module as claimed in claim 8, wherein under the first test mode, the pixel array is irradiated by a light source.

10. The pixel array module as claimed in claim 1, wherein the test mode comprises a second test mode, and under the second test mode, when a pixel voltage value of the test signal is greater than a second reference voltage, the test circuit unit determines that the pixel to be tested passes through the test.

11. The pixel array module as claimed in claim 1, wherein the test circuit unit comprises:
   a comparison unit, coupled to the pixel array, and comparing the test signal and a reference signal to output a comparison result; and
   a determination unit, coupled to the comparison unit, determining whether a number of the pixels in the pixel array that fail the test is greater than a threshold according to the comparison result, and outputting a determination result.

12. The pixel array module as claimed in claim 11, wherein the test circuit unit further comprises:
   an address counting unit, coupled to the comparison unit, and counting addresses of the pixels to output a counting result; and
   a storage unit, coupled to the comparison unit and the address counting unit, and storing the comparison result and the counting result to record the addresses and numbers of the pixels in the pixel array that pass through the test and fail the test.

13. The pixel array module as claimed in claim 1, further comprising:
   a switch network, coupled between the test circuit unit and the test line, and selecting at least one pixel row in the pixel array for testing according to an instruction of the test circuit unit,
   wherein in the at least one pixel row selected for testing, the switch network selects to couple the first terminals of the transistors to the test circuit unit, and in the pixel rows that are not selected for testing, the switch network selects to couple the first terminals of the transistors to a stable voltage.

14. The pixel array module as claimed in claim 1, further comprising:
   a plurality of fuses, respectively coupled between the test lines and the test circuit unit, wherein after testing of the pixels is completed, the fuses are fused to block an electrical connection between the pixel array and the test circuit unit.

15. The pixel array module as claimed in claim 1, wherein the pixel array is an image sensing pixel array of a three-dimensional stacked image sensor, wherein the three-dimensional stacked image sensor comprises the image sensing pixel array, a signal converter array and an image processor array.

16. The pixel array module as claimed in claim 15, wherein the pixel array comprises a plurality of sub pixel arrays, and each of the sub pixel arrays is coupled to the signal converter array through the stacking element.

17. The pixel array module as claimed in claim 1, wherein the transistor included in each of the pixels is a source follower transistor.

18. A self-test method for a pixel array module, wherein the pixel array module comprises a pixel array, the pixel array comprises a plurality of pixels, each of the pixels comprises a transistor, and each of the transistors has a first terminal and a second terminal, the self-test method comprising:
   switching the pixel array to a test mode;
   providing a test signal to test at least one of the pixels by using a stable power;
   comparing the test signal with a reference signal to output a comparison result; and
   determining whether a number of the pixels in the pixel array that fail the test is greater than a threshold according to the comparison result, and outputting a determination result, wherein the test signal is transmitted from the second terminal of the transistor of the pixel to be tested to the first terminal thereof, and a driving signal of each of the transistors is transmitted from the first terminal to the second terminal thereof under a normal mode, wherein under the normal mode, the first terminals of the transistors are coupled to the stable power through a plurality of test lines, and the second terminals of the transistors are coupled to a stacking element.

19. The self-test method as claimed in claim 18, wherein the step of switching the pixel array to the test mode comprises:

setting the pixel array to a first test mode, wherein under the first test mode, the test signal is compared with a first reference voltage of the reference signal.

20. The self-test method as claimed in claim 19, wherein under the first test mode, when a pixel voltage value of the test signal is smaller than the first reference voltage, the pixel to be tested is determined to pass through the test.

21. The self-test method as claimed in claim 18, further comprising:

irradiating the pixel array by a light source, so as to set the pixel array to the first test mode.

22. The self-test method as claimed in claim 18, wherein the step of switching the pixel array to the test mode comprises:

setting the pixel array to a second test mode, wherein under the second test mode, the test signal is compared with a second reference voltage of the reference signal.

23. The self-test method as claimed in claim 20, wherein under the second test mode, when a pixel voltage value of the test signal is greater than the second reference voltage, the pixel to be tested is determined to pass through the test.

24. The self-test method as claimed in claim 18, wherein the pixel array module further comprises the test lines, a plurality of fuses and a test circuit unit, the test lines are coupled between the pixel array and the test circuit unit, the fuses are respectively coupled between the test lines and the test circuit unit, and the self-test method further comprises:

fusing the fuses to block an electrical connection between the pixel array and the test circuit unit after testing of the pixels is completed.

25. The self-test method as claimed in claim 18, wherein the pixel array is an image sensing pixel array of a three-dimensional stacked image sensor.

26. The self-test method as claimed in claim 18, wherein the transistor included in each of the pixels is a source follower transistor.

* * * * *